(12) United States Patent
Togawa et al.

(10) Patent No.: US 7,465,214 B2
(45) Date of Patent: Dec. 16, 2008

(54) SUBSTRATE HOLDING APPARATUS AND POLISHING APPARATUS

(75) Inventors: Tetsuji Togawa, Tokyo (JP); Osamu Nabeya, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/555,702

(22) PCT Filed: Feb. 25, 2004

(86) PCT No.: PCT/JP2004/002219

§ 371 (c)(1),
(2), (4) Date: Nov. 4, 2005

(87) PCT Pub. No.: WO2004/105112

PCT Pub. Date: Dec. 2, 2004

(65) Prior Publication Data

US 2007/0111637 A1 May 17, 2007

(30) Foreign Application Priority Data

May 20, 2003 (JP) ............................. 2003-142276

(51) Int. Cl.
*B24B 49/00* (2006.01)
(52) U.S. Cl. ................. 451/1; 451/41; 451/5; 451/8
(58) Field of Classification Search .............. 451/8, 451/5–7, 9–10, 285–288, 41, 1
See application file for complete search history.

(56) References Cited

U.S. PATENT DOCUMENTS

| 5,857,893 | A | * | 1/1999 | Olsen et al. ............... 451/5 |
| 5,904,609 | A | * | 5/1999 | Fukuroda et al. .......... 451/8 |
| 5,957,751 | A | * | 9/1999 | Govzman et al. .......... 451/8 |
| 6,435,956 | B1 | | 8/2002 | Ohwada et al. |
| 6,663,466 | B2 | * | 12/2003 | Chen et al. ............... 451/8 |
| 2002/0132559 | A1 | | 9/2002 | Togawa |
| 2005/0260925 | A1 | | 11/2005 | Togawa |
| 2007/0111637 | A1 | * | 5/2007 | Togawa et al. ............ 451/1 |

FOREIGN PATENT DOCUMENTS

| EP | 1 240 977 A2 | 9/2002 |
| JP | 10-166257 | 6/1998 |
| JP | 2002-280337 | 9/2002 |

* cited by examiner

*Primary Examiner*—Lee D Wilson
(74) *Attorney, Agent, or Firm*—Wenderoth, Lind & Ponack, L.L.P.

(57) ABSTRACT

A substrate holding apparatus holds a substrate such as a semiconductor and presses the substrate against a polishing surface. The substrate holding apparatus includes a top ring body (2) for holding the substrate, a plurality of fluid passages (33, 34, 35, 36) for supplying a fluid to a plurality of pressure chambers (22, 23, 24, 25) defined in the top ring body, and a plurality of sensors (S1, S2, S3, S4) disposed in the fluid passages, respectively, for detecting flowing states of the fluid which flows through the fluid passages.

12 Claims, 7 Drawing Sheets

SUBSTRATE HOLDING APPARATUS AND POLISHING APPARATUS

TECHNICAL FIELD

The present invention relates to a substrate holding apparatus for holding a substrate to be polished and pressing the substrate against a polishing surface, and more particularly to a substrate holding apparatus for holding a substrate such as a semiconductor wafer in a polishing apparatus for polishing the substrate to a flat finish. The present invention also relates to a polishing apparatus having such a substrate holding apparatus.

BACKGROUND ART

In recent years, semiconductor devices have become more integrated, and structures of semiconductor elements have become more complicated. Further, the number of layers in multilayer interconnections used for a logical system has been increased. Accordingly, irregularities on a surface of a semiconductor device have increased, so that step heights on the surface of the semiconductor device tend to be larger. This is because, in a manufacturing process of a semiconductor device, a thin film is formed on a semiconductor device, then micromachining processes, such as patterning or forming holes, are performed on the semiconductor device, and these processes are repeated many times to form subsequent thin films on the semiconductor device.

When the number of irregularities is increased on a surface of a semiconductor device, the following problems arise. The thickness of a film formed in a portion having a step is relatively small when a thin film is formed on a semiconductor device. An open circuit is caused by disconnection of interconnections, or a short circuit is caused by insufficient insulation between interconnection layers. As a result, good products cannot be obtained, and the yield tends to be reduced. Further, even if a semiconductor device initially works normally, reliability of the semiconductor device is lowered after long-term use. At the time of exposure in a lithography process, if the irradiation surface has irregularities, then a lens unit in an exposure system is locally unfocused. Therefore, if the irregularities of the surface of the semiconductor device are increased, then it is difficult to form a fine pattern itself on the semiconductor device.

Accordingly, in a manufacturing process of a semiconductor device, it increasingly becomes important to planarize a surface of the semiconductor device. The most important one of the planarizing technologies is CMP (Chemical Mechanical Polishing). In the chemical mechanical polishing, with use of a polishing apparatus, while a polishing liquid containing abrasive particles such as silica ($SiO_2$) therein is supplied onto a polishing surface such as a polishing pad, a substrate such as a semiconductor wafer is brought into sliding contact with the polishing surface, so that the substrate is polished.

This type of polishing apparatus comprises a polishing table having a polishing surface constituted by a polishing pad, and a substrate holding apparatus, which is referred to as a top ring or a carrier head, for holding a semiconductor wafer. When a semiconductor wafer is polished with such a polishing apparatus, the semiconductor wafer is held and pressed against the polishing table under a predetermined pressure by the substrate holding apparatus. At this time, the polishing table and the substrate holding apparatus are moved relatively to each other to bring the semiconductor wafer into sliding contact with the polishing surface, so that the surface of the semiconductor wafer is polished to a flat mirror finish.

In such a polishing apparatus, if a relative pressing force between the semiconductor wafer being polished and the polishing surface of the polishing pad is not uniform over an entire surface of the semiconductor wafer, then the semiconductor wafer may insufficiently be polished or may excessively be polished at some portions depending on the pressing force applied to those portions of the semiconductor wafer. Therefore, it has been attempted to form a surface, for holding a semiconductor wafer, of a substrate holding apparatus by an elastic membrane made of an elastic material such as rubber and to supply fluid pressure such as air pressure to a backside surface of the elastic membrane to unformize pressing forces applied to the semiconductor wafer over an entire surface of the semiconductor wafer.

Further, the polishing pad is so elastic that pressing forces applied to a peripheral portion of the semiconductor wafer being polished become non-uniform, and hence only the peripheral portion of the semiconductor wafer may excessively be polished, which is referred to as "edge rounding". In order to prevent such edge rounding, there has been used a substrate holding apparatus in which a semiconductor wafer is held at its peripheral portion by a guide ring or a retainer ring, and the annular portion of the polishing surface that corresponds to the peripheral portion of the semiconductor wafer is pressed by the guide ring or retainer ring.

The thickness of a thin film formed on a surface of a semiconductor wafer varies from position to position in a radial direction of the semiconductor wafer depending on the film deposition method or the characteristics of a film deposition apparatus. Specifically, the thin film has a film thickness distribution in the radial direction of the semiconductor wafer. Since a conventional substrate holding apparatus, as described above, for uniformly pressing an entire surface of a semiconductor wafer polishes the semiconductor wafer uniformly over the entire surface thereof, it cannot realize a polishing amount distribution that is equal to the aforementioned film thickness distribution on the surface of the semiconductor wafer.

There has been proposed a polishing apparatus for applying locally different pressures to a semiconductor wafer to make the pressing force for pressing a thicker film region on the semiconductor wafer against a polishing surface greater than the pressing force for pressing a thinner film region on the semiconductor wafer against the polishing surface, thereby selectively increasing the polishing rate of the thicker film region. Thus, the overall surface of the substrate can be polished uniformly irrespective of the film thickness distribution that has been provided when the film is grown on the semiconductor wafer.

However, when the pressures of a fluid such as pressurized air supplied to respective pressure chambers positioned on the reverse side of the semiconductor wafer are independently controlled to locally control the pressure applied to the semiconductor wafer to press the semiconductor wafer under locally different pressures, if a membrane (elastic membrane) that is present over the boundary between different pressures is damaged or if airtightness is not kept between the semiconductor wafer and the membrane to cause an air leakage, then the various regions of the semiconductor wafer cannot be pressed under predetermined pressing forces, thus adversely affecting the result of the polishing process. When an air leakage occurs, then the regulator which regulates the pressure of the fluid increases the flow rate of the fluid in order to make up for a pressure drop caused by the air leakage. Therefore, it is difficult to detect a slight air leakage by monitoring fluid pressures. If a single flow meter is used to detect an air leakage, such detection method suffers detection errors frequently and is not reliable enough because a flow of fluid is generated even when the fluid is pressurized in a non-leakage state.

DISCLOSURE OF INVENTION

The present invention has been made in view of the above conventional problems. It is therefore an object of the present invention to provide a substrate holding apparatus which is capable of detecting a leakage quickly if a membrane (elastic membrane) is damaged to cause a leakage from a pressure chamber or if airtightness is not kept between a substrate and the membrane (elastic membrane) to cause a leakage, and a polishing apparatus incorporating such a substrate holding apparatus.

In order to achieve the above object, according to a first aspect of the present invention, there is provided a substrate holding apparatus for holding a substrate and pressing the substrate against a polishing surface, comprising a top ring body for holding the substrate, a plurality of fluid passages for supplying a fluid to a plurality of pressure chambers defined in the top ring body and a plurality of sensors disposed in the fluid passages, respectively, for detecting flowing states of the fluid which flows through the fluid passages.

According to the first aspect of the present invention, a fluid leakage from pressure chambers or a fluid leakage between the substrate which is an object to be polished and a membrane (elastic membrane) can be detected by detecting a flowing state of a pressurized fluid. Therefore, a damage to the elastic membrane which defines the pressure chambers, an assembling failure of the top ring, or the like can be detected. Since the pressures in the pressure chambers can be kept under preset pressure levels, the possibility of damage to the substrate can be lowered. Furthermore, not only a fluid leakage from the pressure chambers but also a dislodgment of the substrate from the lower surface of the top ring during polishing can be detected, thus further reducing the possibility of damage to the substrate.

According to a preferred aspect of the present invention, the sensors are disposed respectively in two of the fluid passages for supplying the fluid to two adjacent ones of the pressure chambers which are divided by a boundary.

With the substrate holding apparatus according to the present invention, when a fluid leakage occurs at the boundary between the two adjacent pressure chambers, the pressurized fluid flows from the pressure chamber having a higher pressure into the pressure chamber having a lower pressure. At this time, a regulator at a higher pressure side supplies the pressurized fluid, and a regulator at a lower pressure side discharges the pressurized fluid into the atmosphere. Consequently, if a fluid leakage occurs at the boundary between two adjacent pressure chambers that are supplied with the pressurized fluid under different pressures, then the pressurized fluid flows at the same flow rate in a fixed direction from the pressure chamber having the higher pressure into the pressure chamber having the lower pressure. Therefore, the fluid leakage at the boundary can be detected when the two sensors detect the flow direction of the pressurized fluid or the same flow rate of the pressurized fluid.

According to a preferred aspect of the present invention, the sensors are capable of detecting a flow direction of the fluid.

According to a preferred aspect of the present invention, the sensors are capable of detecting a flow velocity of the fluid.

According to a preferred aspect of the present invention, the sensors are capable of detecting a flow rate of the fluid.

According to a preferred aspect of the present invention, the sensors are capable of detecting a flow velocity of the fluid and a flow direction of the fluid.

According to another aspect of the present invention, there is provided a polishing apparatus comprising a polishing table having a polishing surface and a substrate holding apparatus for holding a substrate and pressing the substrate against the polishing surface. The substrate holding apparatus comprises a top ring body for holding the substrate, a plurality of fluid passages for supplying a fluid to a plurality of pressure chambers defined in the top ring body, and a plurality of sensors disposed in the fluid passages, respectively, for detecting flowing states of the fluid which flows through the fluid passages.

According to a preferred aspect of the present invention, polishing of the substrate is stopped when the sensors disposed respectively in two of the fluid passages for supplying the fluid to two adjacent ones of the pressure chambers detect respective fixed flow directions of the fluid.

With the polishing apparatus according to the present invention, when a fluid leakage occurs at the boundary between the two adjacent pressure chambers, the pressurized fluid flows from the pressure chamber having a higher pressure into the pressure chamber having a lower pressure. At this time, a regulator at a higher pressure side supplies the pressurized fluid, and a regulator at a lower pressure side discharges the pressurized fluid into the atmosphere. Consequently, if a fluid leakage occurs at the boundary between two adjacent pressure chambers that are supplied with the pressurized fluid under different pressures, then the pressurized fluid flows at the same flow rate in a fixed direction from the pressure chamber having the higher pressure into the pressure chamber having the lower pressure. Therefore, the fluid leakage at the boundary can be detected with higher accuracy when the two sensors detect the flow direction of the pressurized fluid and also the flow rate of the pressurized fluid. When the fluid leakage is detected, the polishing apparatus stops polishing of the substrate.

The polishing apparatus may stop polishing of the substrate by attracting the substrate under vacuum to the top ring and then lifting the top ring with the substrate from the polishing surface. Information as to the stopped polishing process may be recorded, and may subsequently be used when the substrate is to be polished again, or may be used to detect the service life of the membrane because a minute fluid leakage across the membrane can be detected.

According to a preferred aspect of the present invention, the fixed flow directions are a flow direction of the fluid to pressurize the substrate and a flow direction of the fluid to depressurize the substrate.

According to a preferred aspect of the present invention, the fixed flow directions are directions opposite to each other.

According to a preferred aspect of the present invention, polishing of the substrate is stopped when the sensors disposed respectively in two of the fluid passages for supplying the fluid to two adjacent ones of the pressure chambers detect the same flow rate of the fluid.

With the polishing apparatus according to the present invention, when a fluid leakage occurs at the boundary between the two adjacent pressure chambers, the pressurized fluid flows from the pressure chamber having a higher pressure into the pressure chamber having a lower pressure. At this time, a regulator at a higher pressure side supplies the pressurized fluid, and a regulator at a lower pressure side discharges the pressurized fluid into the atmosphere. Consequently, if a fluid leakage occurs at the boundary between two adjacent pressure chambers that are supplied with the pressurized fluid under different pressures, then the pressurized fluid flows at the same flowrate from the pressure chamber having the higher pressure into the pressure chamber having the lower pressure. Therefore, the fluid leakage across the boundary can be detected when the two sensors detect the same flow rate of the pressurized fluid or opposite flow directions of the pressurized fluid. When the fluid leakage is detected, the polishing apparatus stops polishing of the substrate.

According to a preferred aspect of the present invention, polishing of the substrate is stopped when the sensors disposed respectively in two of the fluid passages for supplying the fluid to two adjacent ones of the pressure chambers detect respective fixed flow directions of the fluid and respective fixed flow rates of the fluid.

According to a preferred aspect of the present invention, the fixed flow directions are directions opposite to each other.

According to a preferred aspect of the present invention, the fixed flow directions are directions opposite to each other and the fixed flow rates are identical to each other.

BEST MODE FOR CARRYING OUT THE INVENTION

A substrate holding apparatus and a polishing apparatus according to embodiments of the present invention will be described in detail below with reference to the drawings.

Figure 1:
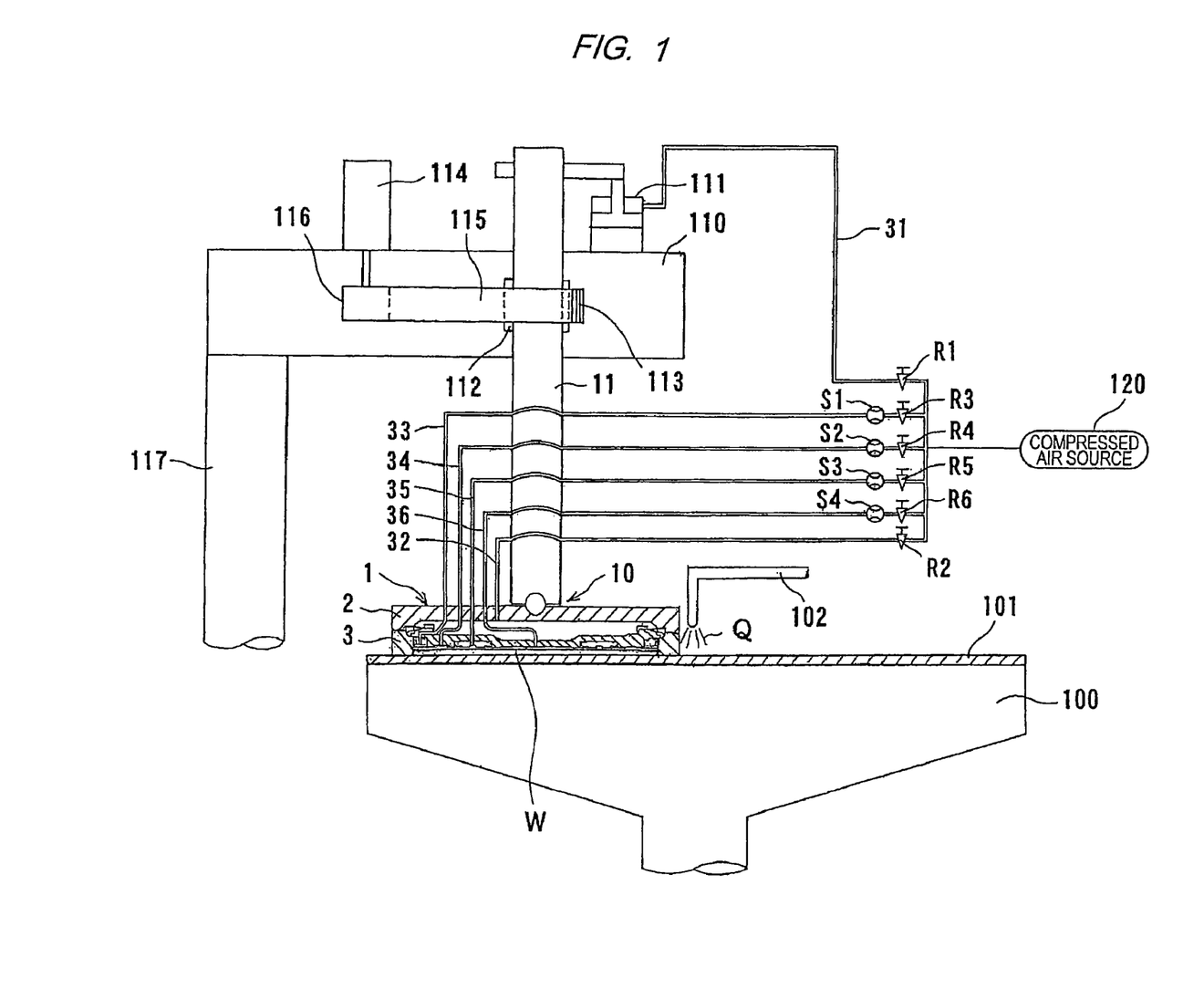
FIG. 1 is a cross-sectional view showing an overall arrangement of a polishing apparatus incorporating a substrate holding apparatus according to an embodiment of the present invention.

FIG. 1 is a cross-sectional view showing an entire arrangement of a polishing apparatus having a substrate holding apparatus according to the present invention. The substrate holding apparatus serves to hold a substrate such as a semiconductor wafer to be polished and to press the substrate against a polishing surface on a polishing table. As shown in FIG. 1, a polishing table 100 having a polishing pad 101 attached to an upper surface thereof is provided underneath a top ring 1 constituting a substrate holding apparatus according to the present invention. A polishing liquid supply nozzle 102 is provided above the polishing table 100, and a polishing liquid Q is supplied onto the polishing pad 101 on the polishing table 100 from the polishing liquid supply nozzle 102.

Various kinds of polishing pads are available on the market. For example, some of these are SUBA800, IC-1000, and IC-1000/SUBA400 (two-layer cloth) manufactured by Rodel Inc., and Surfin xxx-5 and Surfin 000 manufactured by Fujimi Inc. SUBA800, Surfin xxx-5, and Surfin 000 are non-woven fabrics bonded by urethane resin, and IC-100 is made of rigid foam polyurethane (single-layer). Foam polyurethane is porous and has a large number of fine recesses or holes formed in its surface.

In the above embodiments, although the polishing pad serves as the polishing surface, the present invention is not limited to the above structure. For example, the polishing surface may be constituted by a fixed abrasive. The fixed abrasive is formed into a flat plate comprising abrasive particles fixed by a binder. With the fixed abrasive for polishing, the polishing process is performed by abrasive particles that are self-generated from the fixed abrasive. The fixed abrasive comprises abrasive particles, a binder, and pores. For example, cerium dioxide ($CeO_2$) or silicon oxide ($SiO_2$) or alumina ($Al_2O_3$) having an average particle diameter of 0.5 µm or less is used as an abrasive particle, and thermosetting resin such as epoxy resin or urethane resin or thermoplastic resin such as MBS resin or ABS resin is used as a binder. Such a fixed abrasive forms a harder polishing surface. The fixed abrasive includes a fixed abrasive pad having a two-layer structure formed by a thin layer of a fixed abrasive and an elastic polishing pad attached to a lower surface of the thin layer of the fixed abrasive.

The top ring 1 is connected to a top ring drive shaft 11 by a universal joint 10, and the top ring drive shaft 11 is coupled to a top ring air cylinder 111 fixed to a top ring head 110. The top ring air cylinder 111 operates to move the top ring drive shaft 11 vertically to thereby lift and lower the top ring 1 as a whole and to press a retainer ring 3 fixed to a lower end of a top ring body 2 against the polishing table 100.

The top ring air cylinder 111 is connected to a compressed air source (pressurized fluid source) 120 via a fluid passage 31 and a regulator R1. The regulator R1 can regulate pressure of compressed air or the like which is supplied to the top ring air cylinder 111. Thus, it is possible to adjust a pressing force to press the polishing pad 101 with the retainer ring 3.

The top ring drive shaft 11 is connected to a rotary sleeve 112 by a key (not shown). The rotary sleeve 112 has a timing pulley 113 fixedly disposed at a peripheral portion thereof. A top ring motor 114 is fixed to the top ring head 110, and the timing pulley 113 is coupled to a timing pulley 116 mounted on the top ring motor 114 via a timing belt 115. Therefore, when the top ring motor 114 is energized for rotation, the rotary sleeve 112 and the top ring drive shaft 11 are rotated in unison with each other via the timing pulley 116, the timing belt 115, and the timing pulley 113 to thereby rotate the top ring 1. The top ring head 110 is supported on a top ring head shaft 117 rotatably supported on a frame (not shown).

Figure 2:
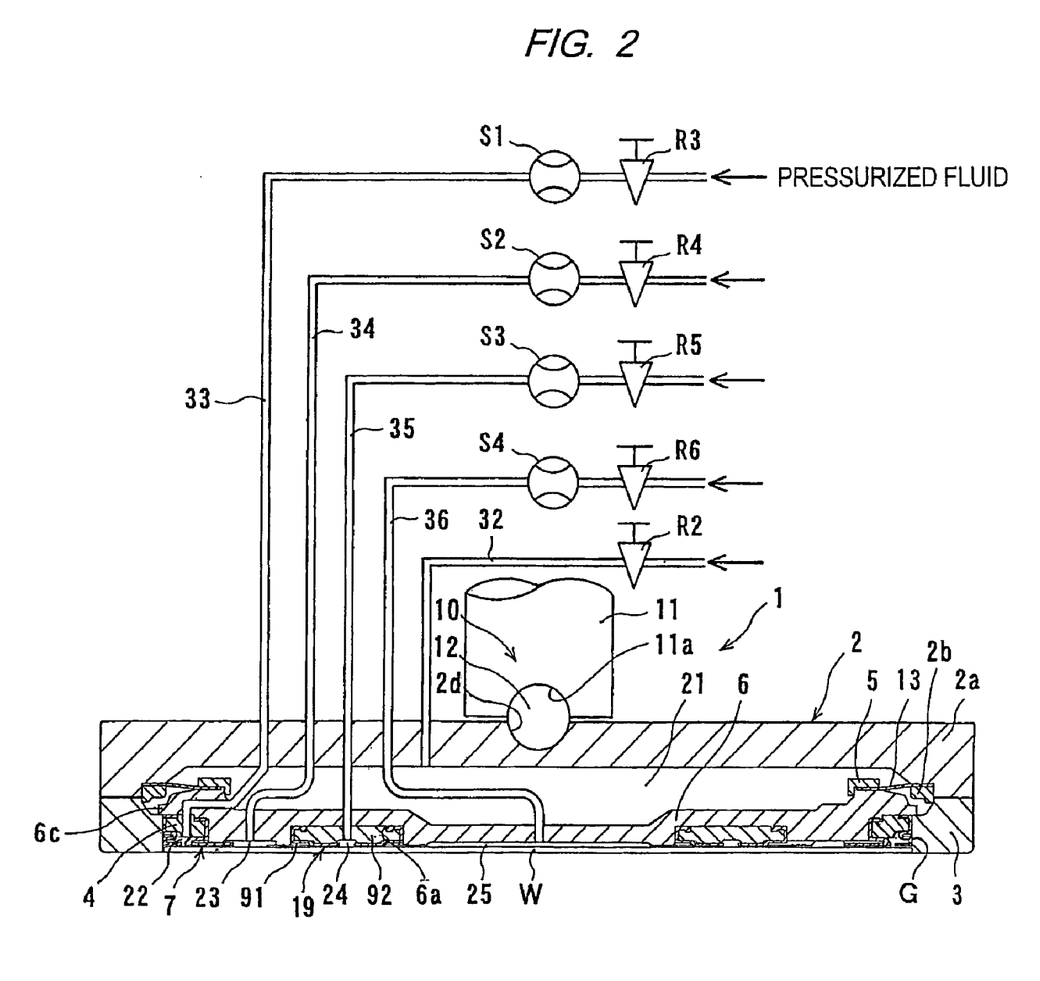
FIG. 2 is a vertical cross-sectional view of a top ring according to the embodiment of the present invention.

Next, the top ring 1 constituting a substrate holding apparatus according to the present invention will be described below. FIG. 2 is a vertical cross-sectional view showing the top ring 1.

As shown in FIG. 2, the top ring 1 constituting a substrate holding apparatus comprises a top ring body 2 in the form of a cylindrical housing with a receiving space defined therein, and an annular retainer ring 3 fixed to the lower end of the top ring body 2. The top ring body 2 is made of a material having high strength and rigidity, such as metal or ceramics. The retainer ring 3 is made of highly rigid synthetic resin, ceramics, or the like.

The top ring body 2 comprises a cylindrical housing 2*a* and an annular pressurizing sheet support 2*b* fitted into the cylindrical portion of the housing 2*a*. The retainer ring 3 is fixed to the lower end of the housing 2*a* of the top ring body 2. The retainer ring 3 has a lower portion projecting radially inwardly. The retainer ring 3 may be formed integrally with the top ring body 2.

The top ring drive shaft 11 is disposed above the central portion of the housing 2*a* of the top ring body 2, and the top ring body 2 is coupled to the top ring drive shaft 11 by the universal joint 10. The universal joint 10 has a spherical bearing mechanism by which the top ring body 2 and the top ring drive shaft 11 are tiltable with respect to each other, and a rotation transmitting mechanism for transmitting the rotation of the top ring drive shaft 11 to the top ring body 2. The spherical bearing mechanism and the rotation transmitting mechanism transmit a pressing force and a rotating force from the top ring drive shaft 11 to the top ring body 2 while allowing the top ring body 2 and the top ring drive shaft 11 to be tilted with respect to each other.

The spherical bearing mechanism comprises a hemispherical concave recess 11*a* defined centrally in the lower surface of the top ring drive shaft 11, a hemispherical concave recess 2*d* defined centrally in the upper surface of the housing 2*a*, and a bearing ball 12 made of a highly hard material such as ceramics and interposed between the concave recesses 11*a* and 2*d*. On the other hand, the rotation transmitting mechanism comprises drive pins (not shown) fixed to the top ring drive shaft 11, and driven pins (not shown) fixed to the housing 2*a*. Even if the top ring body 2 is tilted with respect to the top ring drive shaft 11, the drive pins and the driven pins remain in engagement with each other while contact points are displaced because the drive pin and the driven pin are vertically movable relatively to each other. Thus, the rotation transmitting mechanism reliably transmits rotational torque of the top ring drive shaft 11 to the top ring body 2.

The top ring body 2 and the retainer ring 3 secured to the top ring body 2 have a space defined therein, which accommodates therein an annular holder ring 5, and a disk-shaped chucking plate 6 (vertically movable member) which is vertically movable within the receiving space in the top ring body 2. The chucking plate 6 may be made of metal. However, when the thickness of a thin film formed on a surface of a semiconductor wafer is measured by a method using eddy current in such a state that the semiconductor wafer to be polished is held by the top ring, the chucking plate 6 should preferably be made of a non-magnetic material, e.g., an insulating material such as epoxy glass, fluororesin, or ceramics.

A pressurizing sheet 13 comprising an elastic membrane extends between the holder ring 5 and the top ring body 2. The pressurizing sheet 13 has a radially outer edge clamped between the housing 2*a* and the pressurizing sheet support 2*b* of the top ring body 2, and a radially inner edge clamped between an upper end portion of the chucking plate 6 and the holder ring 5. The top ring body 2, the chucking plate 6, the holder ring 5, and the pressurizing sheet 13 jointly define a pressure chamber 21 in the top ring body 2. As shown in FIG. 2, a fluid passage 32 comprising tubes and connectors communicates with the pressure chamber 21, and the pressure chamber 21 is connected to the compressed air source 120 through a regulator R2 provided in the fluid passage 32. The pressurizing sheet 13 is made of a highly strong and durable rubber material such as ethylene propylene rubber (EPDM), polyurethane rubber, or silicone rubber.

In the case where the pressurizing sheet 13 is made of an elastic material such as rubber, if the pressurizing sheet 13 is fixedly clamped between the retainer ring 3 and the top ring body 2, then a desired horizontal surface cannot be maintained on the lower surface of the retainer ring 3 because of elastic deformation of the pressurizing sheet 13 as an elastic material. In order to prevent such a drawback, the pressurizing sheet 13 is clamped between the housing 2*a* of the top ring body 2 and the pressurizing sheet support 2*b* provided as a separate member in the present embodiment. The retainer ring 3 may vertically be movable with respect to the top ring body 2, or the retainer ring 3 may have a structure capable of pressing the polishing surface independently of the top ring body 2. In such cases, the pressurizing sheet 13 is not necessarily fixed in the aforementioned manner.

An annular edge membrane (elastic membrane) 7 held in contact with the outer circumference edge of the semiconductor wafer W held by the top ring 1 is mounted on the outer circumference edge of the chucking plate 6. The edge membrane 7 has an upper end sandwiched between the outer circumference edge of the chucking plate 6 and the annular edge ring 4. In this manner, the edge membrane 7 is mounted on the chucking plate 6.

As shown in FIG. 2, when the semiconductor wafer W is held by the top ring 1, a pressure chamber 22 is defined in the edge membrane 7. A fluid passage 33 comprising tubes and connectors communicates with the pressure chamber 22, and the pressure chamber 22 is connected to the compressed air source 120 through a regulator R3 provided in the fluid passage 33. The edge membrane 7 is made of a highly strong and durable rubber material such as ethylene propylene rubber (EPDM), polyurethane rubber, or silicone rubber, as with the pressurizing sheet 13. The rubber material of the edge membrane 7 should preferably have a hardness (duro) ranging from 20 to 60.

When the semiconductor wafer W is polished, the semiconductor wafer W is rotated by rotation of the top ring 1. The edge membrane 7 alone has a small contact area with the semiconductor wafer W, and is liable to fail to transmit a sufficient rotating torque. Therefore, an annular intermediate air bag 19 for transmitting a sufficient torque to the semiconductor wafer W is fixed to the lower surface of the chucking plate 6 so as to be held in contact with the semiconductor wafer W. The intermediate air bag 19 is disposed radially inwardly of the edge membrane 7, and held in contact with the semiconductor wafer W through a contact area large enough to transmit a sufficient torque to the semiconductor wafer W. The intermediate air bag 19 serves to perform a profile control process.

The intermediate air bag 19 comprises an elastic membrane 91 which is brought into contact with the upper surface of the semiconductor wafer W, and an air bag holder 92 for removably holding the elastic membrane 91. The air bag holder 92 is fixedly mounted by screws (not shown) in an annular groove 6*a* that is defined in the lower surface of the chucking plate 6. The elastic membrane 91 constituting the intermediate air bag 19 is removably mounted on the lower surface of the chucking plate 6 by an upper end of the elastic membrane 91 which is sandwiched between the annular groove 6*a* and the air bag holder 92.

When the semiconductor wafer W is held by the top ring 1, a pressure chamber 24 is defined in the intermediate air bag 19 by the elastic membrane 91 and the air bag holder 92. A fluid passage 35 comprising tubes and connectors communicates with the pressure chamber 24, and the pressure chamber 24 is connected to the compressed air source 120 through a regulator R5 provided in the fluid passage 35. The elastic membrane 91 is made of a highly strong and durable rubber material, such as ethylene propylene rubber (EPDM), polyurethane rubber, or silicone rubber, as with the pressurizing sheet 13.

An annular space defined by the edge membrane 7, the intermediate air bag 19, the semiconductor wafer W, and the chucking plate 6 serves as a pressure chamber 23. A fluid passage 34 comprising tubes and connectors communicates with the pressure chamber 23, and the pressure chamber 23 is connected to the compressed air source (pressurized fluid source) 120 through a regulator R4 provided in the fluid passage 34.

A circular space defined by the intermediate air bag 19, the semiconductor wafer W, and the chucking plate 6 serves as a pressure chamber 25. A fluid passage 36 comprising tubes and connectors communicates with the pressure chamber 25, and the pressure chamber 25 is connected to the compressed air source 120 through a regulator R6 provided in the fluid passage 36. The fluid passages 32, 33, 34, 35 and 36 are connected to the respective regulators R2 through R6 through a rotary joint (not shown) disposed on an upper end of the top ring head 110.

Since there is a small gap G between the outer circumferential surface of the edge membrane 7 and the retainer ring 3, members including the edge ring 4, the chucking plate 6, the edge membrane 7 mounted on the chucking plate 6, and the like are vertically movable with respect to the top ring body 2 and the retainer ring 3, and hence form a floating structure. The chucking plate 6 has a plurality of protrusions 6c projecting outwardly from its outer circumferential edge. When the protrusions 6c engage an upper surface of the inwardly projecting portion of the retainer ring 3, downward movement of the members including the chucking plate 6, etc. is limited to a certain position.

Figure 3A:
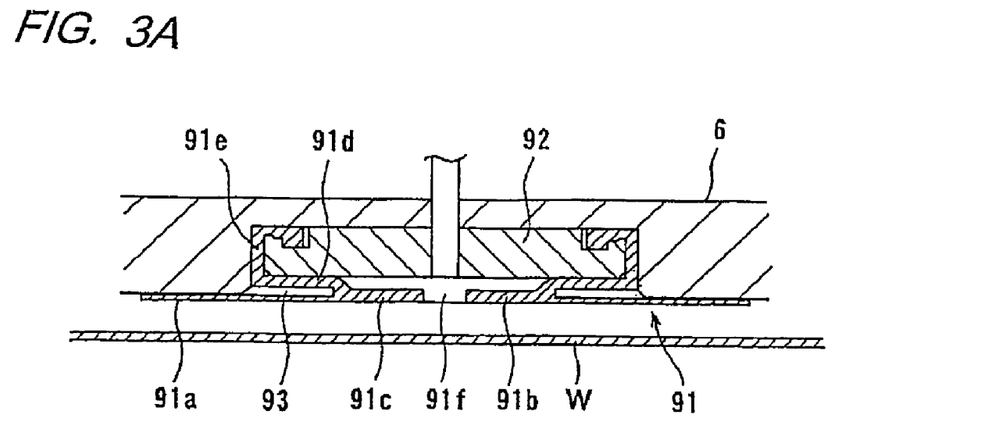
FIGS. 3A through 3C are enlarged cross-sectional views of an intermediate air bag shown in FIG. 2.
Figure 3B:
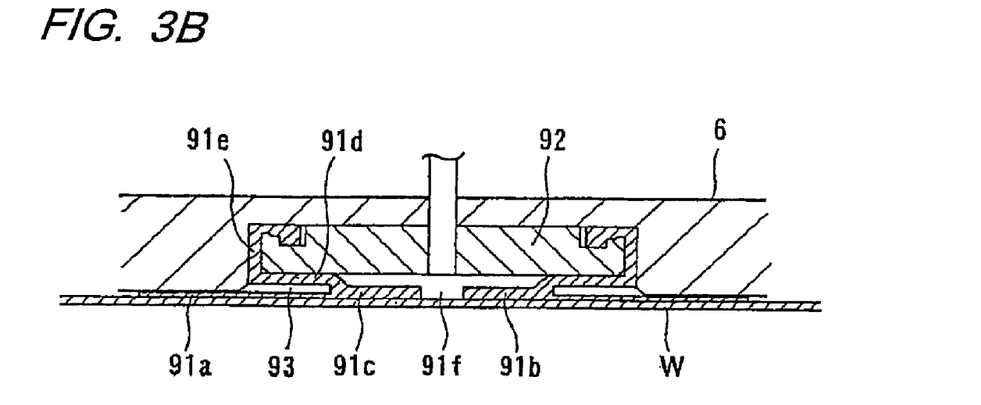
Figure 3C:
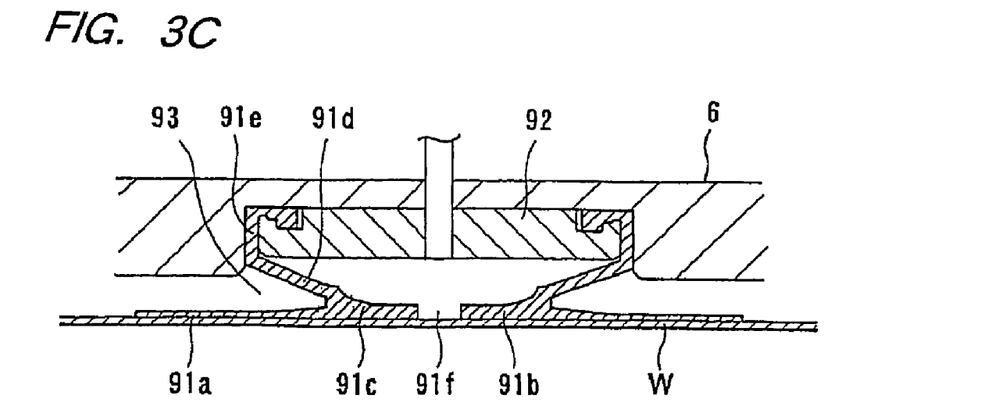

The intermediate air bag 19 will be described in detail below with reference to FIGS. 3A through 3C. FIGS. 3A through 3C are enlarged cross-sectional views showing the intermediate air bag shown in FIG. 2.

As shown in FIG. 3A, the elastic membrane 91 of the intermediate air bag 19 according to the present embodiment has an intermediate contact portion 91b having a radially outwardly extending flange 91a, an extension 91d extending radially outwardly from a base 91c of the flange 91a and defining an annular recess 93 between the extension 91d and the flange 91a, and a joint 91e joined to the chucking plate 6 by the air bag holder 92. The extension 91d has an outer end positioned radially inwardly of the flange 91a, and the joint 91e extends upwardly from the outer end of the extension 91d. The flange 91a, the intermediate contact portion 91b, the joint 91e, and the extension 91d are integrally formed by an elastic material. The intermediate contact portion 91b has an opening 91f defined centrally therein.

With the above arrangement, when the semiconductor wafer W is polished in such a state that the chucking plate 6 is lifted upwardly after the semiconductor wafer W is brought into intimate contact with the intermediate contact portion 91b of the intermediate air bag 19 (see FIG. 3B), the upward force applied to the joint 91e is converted by the extension 91d into a horizontal or oblique force which is then applied to the base 91c of the flange 91a (see FIG. 3C). Therefore, the upward force applied to the base 91c of the flange 91a is minimized, and hence no excessive upward force is imposed on the intermediate contact portion 91b. Accordingly, no vacuum is created in the vicinity of the base 91c, and a uniform polishing rate is achieved over the entire surface of the intermediate contact portion 91b except the flange 91a.

The thickness of the joint 91e and the length of the flange 91a may be of different values in their radially inward and outward regions, and the length of the extension 91d may also be of different values in its radially inward and outward regions. Furthermore, the thickness of the flange 91a may be changed depending on the type of the film to be polished on the semiconductor wafer W and the type of the polishing pad used. If the resistance and polishing torque transmitted to the semiconductor wafer W are large, then the flange 91a should preferably be made thick in order to prevent itself from being twisted.

Figure 4A:
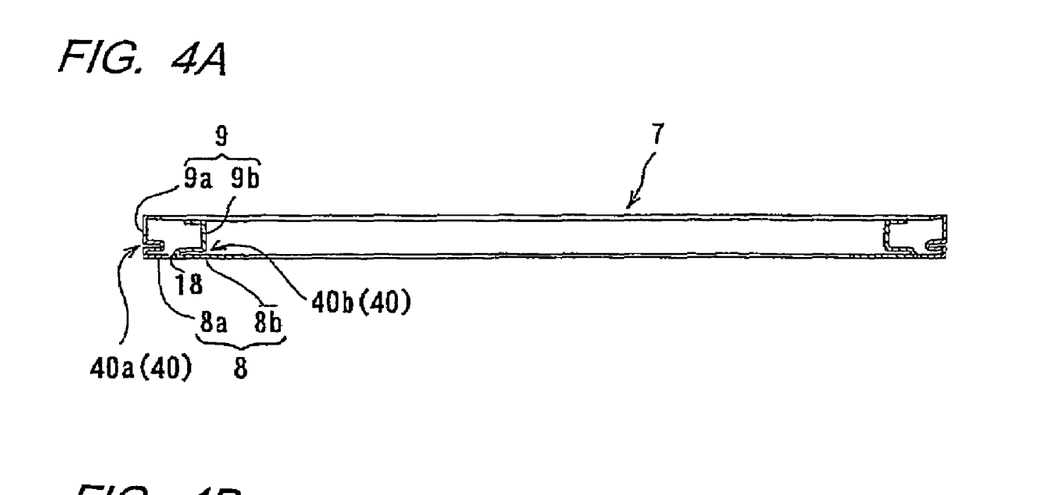
FIG. 4A is a cross-sectional view showing an overall arrangement of an edge membrane according to the embodiment of the present invention.

The edge membrane 7 will be described in detail below with reference to FIGS. 4A through 4C. FIG. 4A is a cross-sectional view showing an overall arrangement of the edge membrane according to the present embodiment, and FIGS. 4B and 4C are fragmentary cross-sectional views of the substrate holding apparatus shown in FIG. 2.

The edge membrane (elastic membrane) 7 according to the present embodiment has an annular contact portion 8 for contacting the outer circumferential edge of the semiconductor wafer W, and an annular circumferential wall 9 extending upwardly from the contact portion 8 and connected to the chucking plate 6. The circumferential wall 9 comprises an outer circumferential wall 9a and an inner circumferential wall 9b disposed radially inwardly of the outer circumferential wall 9a. The contact portion 8 has a shape extending radially inwardly from the circumferential wall 9 (the outer circumferential wall 9a and the inner circumferential wall 9b). The contact portion 8 has a circumferentially extending slit 18 defined in a portion thereof which is positioned between the outer circumferential wall 9a and the inner circumferential wall 9b. The slit 18 divides the contact portion 8 into an outer contact portion 8a and an inner contact portion 8b between the outer circumferential wall 9a and the inner circumferential wall 9b.

Figure 4B:
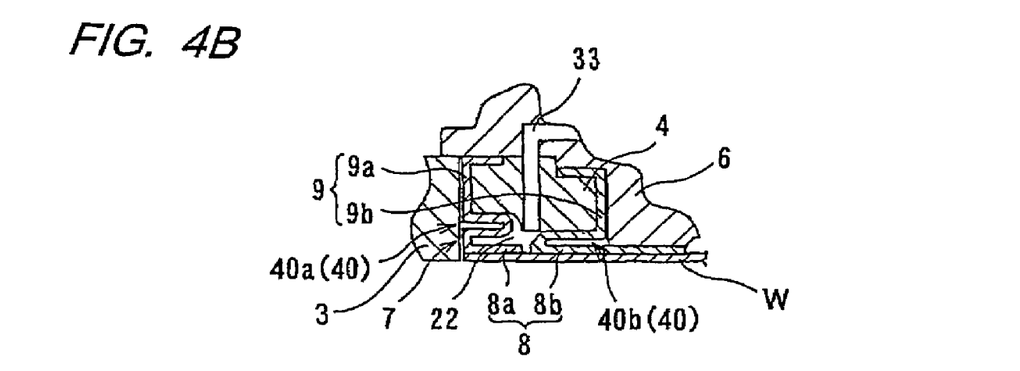
FIGS. 4B and 4C are fragmentary cross-sectional views of the substrate holding apparatus shown in FIG. 2.
Figure 4C:
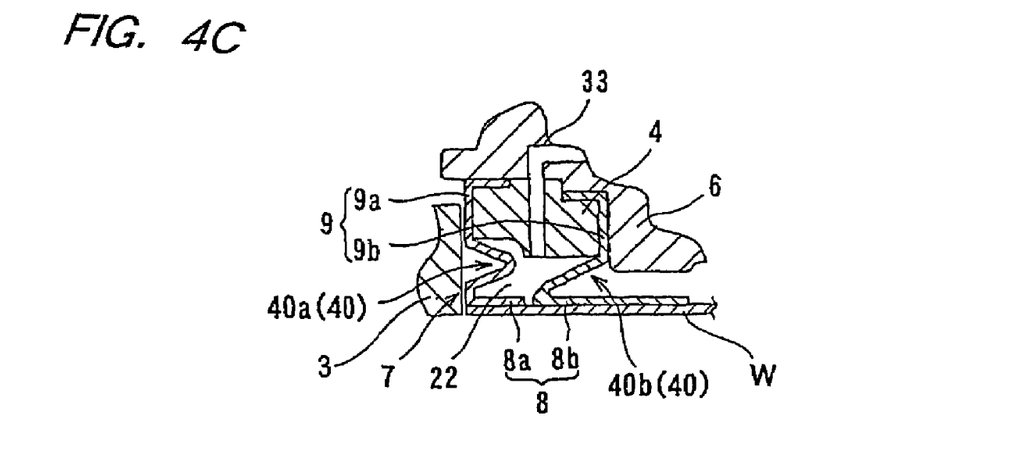

As shown in FIGS. 4B and 4C, the outer circumferential wall 9a and the inner circumferential wall 9b extend upwardly along the outer and inner circumferential surfaces, respectively, of the annular edge ring 4, and have respective upper ends sandwiched between the chucking plate 6 and the upper surface of the edge ring 4. The edge ring 4 is fastened to the chucking plate 6 by screws (not shown), so that the edge membrane 7 is removably attached to the chucking plate 6. The fluid passage 33 extends vertically through the edge ring 4 and is open at the lower surface of the edge ring 4. Therefore, the annular pressure chamber 22 defined by the edge ring 4, the edge membrane 7, and the semiconductor wafer W communicates with the fluid passage 33, and is connected to the compressed air source 120 through the fluid passage 33 and the regulator R3.

The circumferential wall 9 has a stretchable and contractible portion 40 which is stretchable and contractible substantially perpendicularly to the semiconductor wafer W. More specifically, the outer circumferential wall 9a of the circumferential wall 9 has a vertically stretchable and contractible portion 40a, and the stretchable and contractible portion 40a has such a structure that a portion of the outer circumferential wall 9a is folded inwardly along the circumferential direction and then folded back outwardly. The stretchable and contractible portion 40a is positioned near the outer contact portion 8a and located in a position below the edge ring 4. The inner circumferential wall 9b of the circumferential wall 9 also has a vertically stretchable and contractible portion 40b, and the stretchable and contractible portion 40b has such a structure that a portion of the inner circumferential wall 9b near its lower end is folded inwardly along the circumferential direction. With the stretchable and contractible portions 40a, 40b disposed respectively in the outer circumferential wall 9a and the inner circumferential wall 9b, the outer circumferential wall 9a and the inner circumferential wall 9b can largely be stretched and contracted while the contact portion 8 (the outer contact portion 8a and the inner contact portion 8b) maintains its shape. Therefore, as shown in FIG. 4C, when the chucking plate 6 is elevated, the stretchable and contractible portions 40a, 40b are stretched so as to follow the movement of the chucking plate 6, thereby keeping a contact area of the edge membrane 7 and the semiconductor wafer W constant.

The pressure chamber 21 defined above the chucking plate 6 and the pressure chambers 22, 23, 24 and 25 defined below the chucking plate 6 are supplied with a pressurized fluid such as pressurized air or the like, or are vented to the atmospheric pressure, or are evacuated to develop a vacuum therein, through the fluid passages 32, 33, 34, 35 and 36 communicating respectively with those pressure chambers. Specifically, the regulators R2 through R6 in the fluid passages 32 through 36 can regulate the pressures of the pressurized fluid that is supplied to the pressure chambers 21 through 25. Therefore, the pressures in the pressure chambers 21 through 25 can be controlled independently of each other, or the pressure chambers 21 through 25 can be vented to the atmospheric pressure or evacuated to develop a vacuum therein.

As shown in FIGS. 1 and 2, the fluid passages 33, 34, 35 and 36 connected to the respective pressure chambers 22, 23, 24 and 25 have respective sensors S1, S2, S3 and S4 for detecting flow states of the fluid supplied through the fluid passages 33, 34, 35 and 36 to the pressure chambers 22, 23, 24 and 25.

Figure 6A:
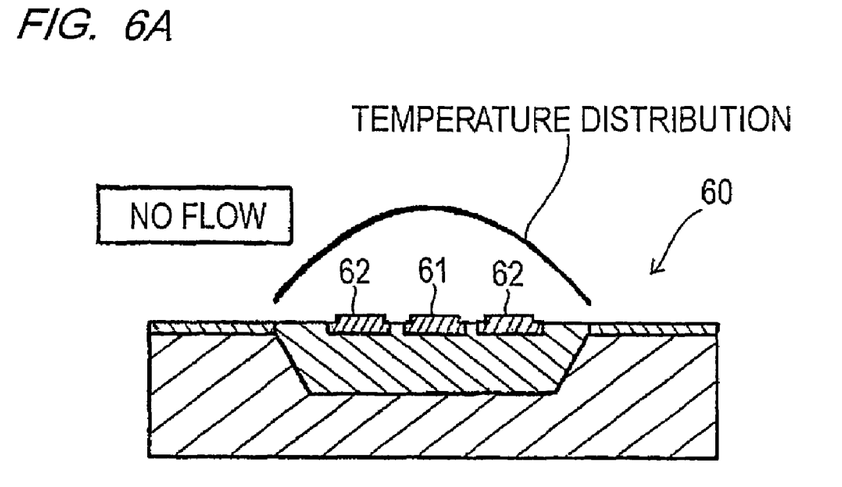
FIGS. 6A through 6C are views showing sensors for detecting the flowing state of fluid, FIG. 6A showing the manner in which there is no flow of a fluid (pressurized air), FIG. 6B showing the manner in which the fluid flows from the left to the right, and FIG. 6C showing the manner in which the fluid flows from the right to the left.

The sensors S1, S2, S3 and S4 will be described below with reference to FIGS. 6A through 6C. FIG. 6A shows the manner in which there is no flow of a fluid (pressurized air), FIG. 6B shows the manner in which the fluid flows from the left to the right, and FIG. 6C shows the manner in which the fluid flows from the right to the left.

Figure 6B:
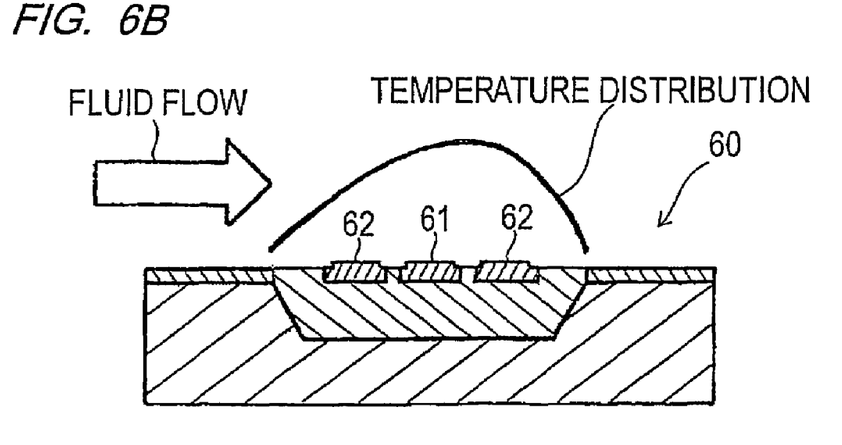
Figure 6C:
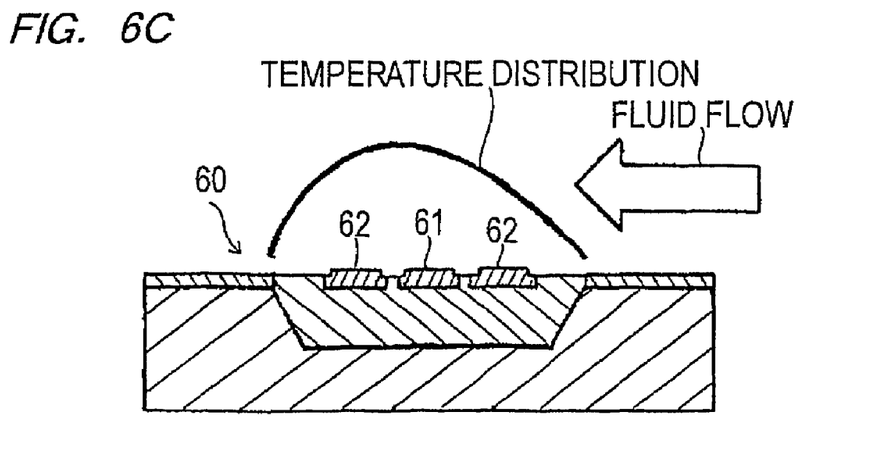

Each of the sensors S1, S2, S3 and S4 comprises a sensor chip 60 shown in FIGS. 6A through 6C. The sensor chip 60 comprises a centrally positioned heater 61 and two temperature sensors 62, 62 disposed one on each side of the heater 61.

With the above arrangement, when the heater 61 is energized, if there is no flow of a fluid over the sensor chip 60 as shown in FIG. 6A, a symmetrical temperature distribution with a highest temperature over the heater 61 is produced across the sensor chip 60. When the fluid flows from the left to the right over the sensor chip 60 as shown in FIG. 6B, the temperature upstream of the heater 61 drops and the temperature downstream of the heater 61 rises, resulting in an asymmetrical temperature distribution across the sensor chip 60. Conversely, when the fluid flows from the right to the left over the sensor chip 60 as shown in FIG. 6C, the temperature upstream of the heater 61 drops and the temperature downstream of the heater 61 rises, resulting in an asymmetrical temperature distribution across the sensor chip 60.

The temperature difference between the temperature distributions shown in FIGS. 6B and 6C emerges as the difference between electric resistances of the temperature sensors 62, and a mass flow rate (flow velocity×density) can be determined from the difference between the electric resistances. Based on this principles, bidirectional flows of the fluid can be detected.

The sensor chip 60 shown in FIGS. 6A through 6C has its output related linearly to the flow rate of the fluid flowing over the sensor chip 60, and hence the flow rate of the fluid flowing over the sensor chip 60 can be detected from the output of the sensor chip 60. Therefore, the sensors S1, S2, S3 and S4 can detect the flow rates of the fluid flowing through the fluid passages 33, 34, 35 and 36, respectively.

The relationship between the pressure chambers 22, 23, 24 and 25 and the sensors S1, S2, S3 and S4 will be described below.

The sensors S1, S2, S3 and S4 are arranged to detect the direction of the flow of the fluid therethrough. Specifically, the sensors S1, S2, S3 and S4 are arranged to detect whether the fluid (pressurized air) flowing through the fluid passages 33, 34, 35 and 36 is flowing from the regulators R3, R4, R5 and R6 to the pressure chambers 22, 23, 24 and 25 or from the pressure chambers 22, 23, 24 and 25 to the regulators R3, R4, R5 and R6.

The sensors S1, S2, S3 and S4 are also arranged to detect the flow velocities of the fluid flowing through the fluid passages 33, 34, 35 and 36. Because the sensors S1, S2, S3 and S4 can detect the flow velocities of the fluid flowing through the fluid passages 33, 34, 35 and 36, the flow rates of the fluid flowing through the fluid passages 33, 34, 35 and 36 can be determined by multiplying the flow velocities of the fluid flowing through the fluid passages 33, 34, 35 and 36 by the cross-sectional areas of the fluid passages 33, 34, 35 and 36, respectively. The calculations may be performed within the sensors S1, S2, S3 and S4 or by a calculating unit of a controller (not shown) which controls the polishing apparatus.

When the pressure chambers 22, 23, 24 and 25 connected to the sensors S1, S2, S3 and S4 thus arranged are supplied with the pressurized fluid (pressurized air) under different pressures, if a fluid leakage occurs at the boundary between different pressures, then the pressurized fluid between two adjacent pressure chambers flows from the pressure chamber having a higher pressure into the pressure chamber having a lower pressure. At this time, the pressurized fluid is supplied from the regulator at a higher pressure side to the regulator at a lower pressure side, and the regulator at the lower pressure side discharges the pressurized fluid into the atmosphere.

Figure 5A:
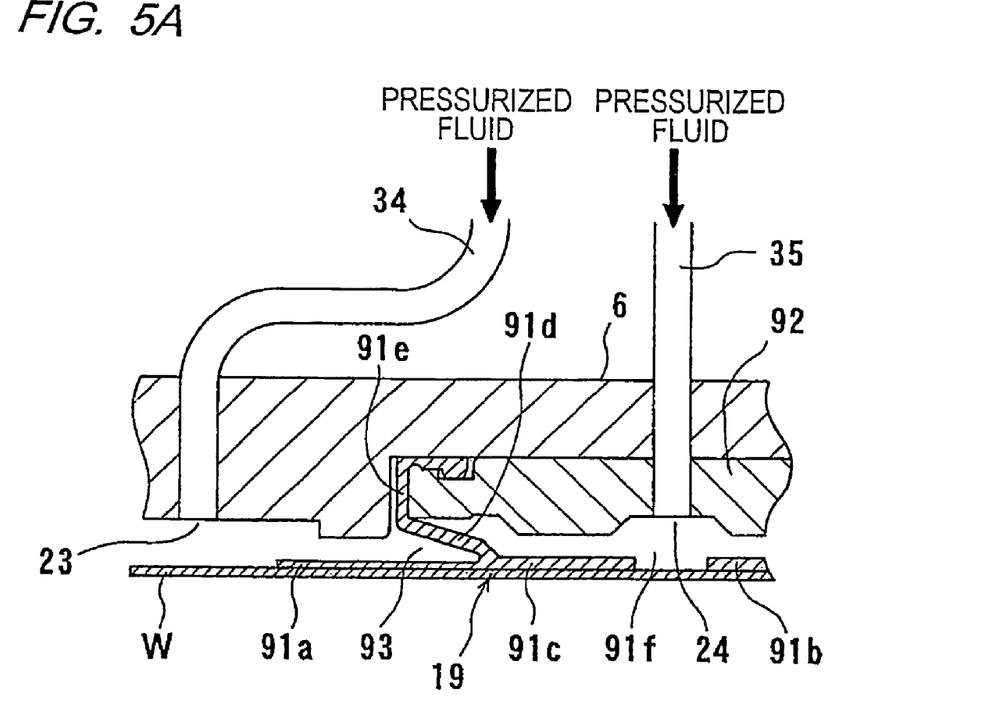
FIG. 5A is a fragmentary cross-sectional view showing the manner in which the substrate holding apparatus having the intermediate air bag is operated normally.
Figure 5B:
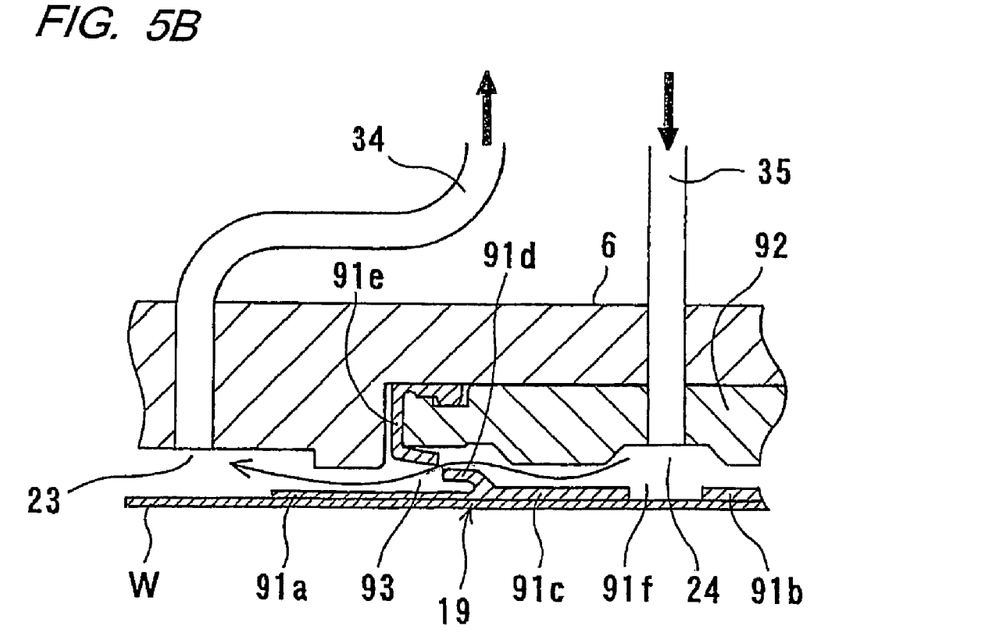
FIG. 5B is a fragmentary cross-sectional view showing the manner in which the substrate holding apparatus having the intermediate air bag which is damaged is operated.

FIG. 5A shows the manner in which the substrate holding apparatus operates with the intermediate air bag 19 being normal, and FIG. 5B shows the manner in which the substrate holding apparatus operates with the intermediate air bag 19 being damaged. As shown in FIG. 5A, if the intermediate air bag 19 is operating normally, when the pressures in the pressure chambers 23, 24 reach preset pressure levels, the flow rates of the fluid flowing through the fluid passages 34, 35 become zero. However, as shown in FIG. 5B, if the intermediate air bag 19 is damaged, the pressurized fluid flows from the pressure chamber 24 having a higher pressure into the pressure chamber 23 having a lower pressure. At this time, the regulator R5 at a higher pressure side supplies the pressurized fluid, and the regulator R4 at a lower pressure side discharges the pressurized fluid into the atmosphere. Consequently, if a fluid leakage occurs at the boundary between two adjacent pressure chambers that are supplied with the pressurized fluid under different pressures, then the pressurized fluid flows at the same flow rate in a fixed direction from the pressure chamber having the higher pressure into the pressure chamber having the lower pressure.

Usually, since the semiconductor wafer is pressurized or depressurized simultaneously in its entirety, the fluid supplied to the adjacent pressure chambers flows in the same direction at different flow rates. Therefore, if sensors capable of detecting a flow direction of the fluid and a flow rate of the fluid are provided in the respective fluid passages for supplying the pressurized fluid to two adjacent pressure chambers having a higher preset pressure and a lower preset pressure, respectively, then a leakage of the fluid from the pressure chamber having the higher pressure to the pressure chamber having the lower pressure can be detected. Specifically, when the two sensors detect a flow of the fluid from the higher pressure side to the lower pressure side and an identical flow rate of the fluid, it can be judged that a leakage of the fluid occurs. In this case, a leakage of the fluid may be determined when the two sensors detect a flow direction of the fluid or an identical flow rate of the fluid. However, both a flow direction of the fluid and an identical flow rate of the fluid should preferably be monitored for stably detecting a leakage of the fluid.

Further, when the air bag is pressurized, or when one of the two air bags is depressurized and the other of the two air bags is pressurized, even if a leakage of the fluid does not occur, there is a high possibility of detection errors if a fluid flow is generated in the fluid passage. In order to prevent the detection errors from occurring, a pressure sensor is provided in the fluid passage, and monitoring of a leakage of the fluid is started after a pressurizing condition is changed and a pressure variation becomes a predetermined value or less, or a predetermined rate or less of a setting pressure. In order to cope with the case where a leakage of the fluid occurs from the beginning and the pressure is unstable, if the pressure does not become stable for a certain period of time, then monitoring of a leakage of the fluid is continued.

On the other hand, it may be possible that without providing a pressure sensor, monitoring of a leakage of the fluid is not performed for a predetermined period of time after a pressurizing condition is changed. However, if this predetermined period of time is short, a detection error may occur. Conversely, if this predetermined period of time is long, the leakage of the fluid may be overlooked. By providing the pressure sensor, the timing of the stable pressure, i.e., the timing of starting of monitoring a leakage of the fluid, can be automatically judged.

The pressure sensor can monitor a pressure variation as described above, and also a pressure drop when a leakage of the fluid occurs from the air bag to the outside of the top ring. When the leakage of the fluid to the outside occurs, since a pressure differential between a pressure of the chamber and the atmospheric pressure is large, the pressure drop is large due to the fluid leakage.

Thus, monitoring of the fluid leakage can be performed only by the pressure sensor. However, a minute leakage of the fluid cannot be detected only by the pressure sensor because of pressure loss in the piping.

Figure 7:
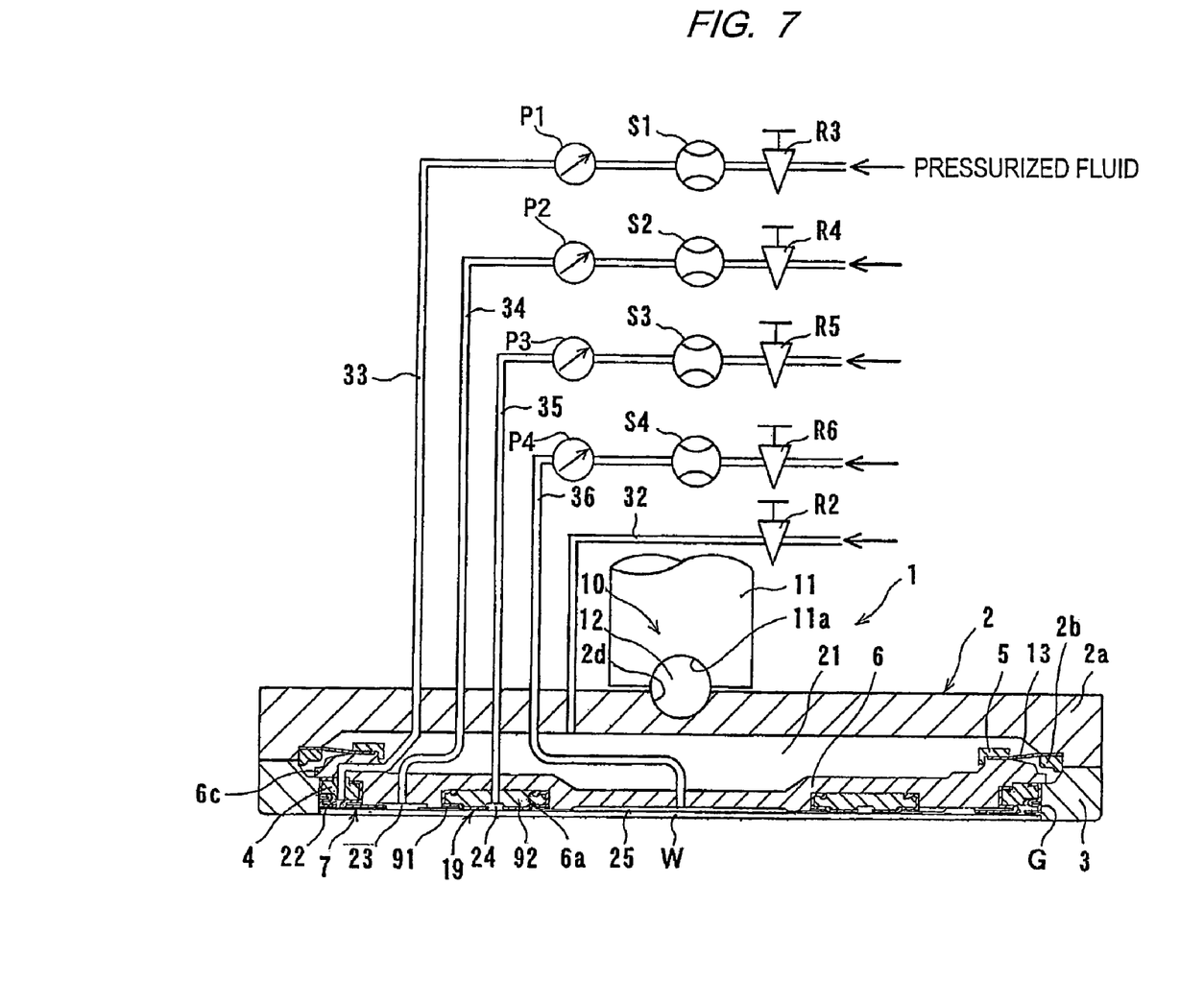
FIG. 7 is a vertical cross-sectional view of a top ring according to another embodiment of the present invention.

FIG. 7 is a vertical cross-sectional view of a top ring according to another embodiment of the present invention. In the embodiment of FIG. 7, pressure sensors P1, P2, P3 and P4, described above, are provided in the respective fluid passages 33, 34, 35 and 36 to measure pressures in the respective fluid passages 33, 34, 35 and 36. By using the pressure sensors P1, P2, P3 and P4, monitoring of a leakage of the fluid is started after a pressurizing condition is changed and a pressure variation becomes a predetermined value or less, or a predetermined rate or less of a setting pressure.

The above arrangement makes it possible to detect a minute leakage of the fluid. Heretofore, it has been customary to determine the service life of a membrane empirically with a sufficient safety margin. According to the present invention, the service life of a membrane can be judged as having expired when a small crack or a microcrack is developed in the membrane and a minute leakage of the fluid from the small crack or the microcrack is actually detected. It is advantageous to detect such minute leakage, because it takes a certain period of time for the membrane until such small crack or microcrack grows into a large hole or a membrane fracture. The minute leakage referred to above should have a flow rate large enough for a pressure controller to correct the fluid pressure with a feedback circuit.

Even an ordinary flow meter incapable of detecting the flow direction of a fluid may be used to detect a leakage of the fluid because if higher and lower pressures acting on the semiconductor wafer are determined, then the fluid flows in the same direction at all times when a leakage of the fluid occurs, provided that the flow meter is installed to detect the fluid flowing in such direction.

As described above, according to the present invention, sensors are installed on both sides of the boundary, where a leakage of a fluid may occur, between regions under different pressures, and a leakage of the fluid can stably be detected by the sensors based on the difference between the flowing state of the fluid at the time the leakage occurs and the flowing state of the fluid at the time no leakage occurs and the pressures are normally acting on the regions.

A sensor for detecting flowing state of the fluid supplied to the pressure chamber 21 may be provided in the fluid passage 32 connected to the pressure chamber 21. This sensor may be identical or similar to the sensors S1 through S4. Since this sensor can detect a leakage of the fluid in the pressurizing sheet 13, when the chucking plate 6 is lifted or lowered, it can be judged that the chucking plate 6 is not operated normally or the chucking plate 6 malfunctions.

Overall operation of the top ring 1 shown in FIGS. 1 and 2 will be described below.

When the semiconductor wafer W is to be supplied to the top ring 1, the top ring 1 is placed in its entirety into a position for transferring the semiconductor wafer W. The pressure chamber 23 and/or the pressure chamber 24 is connected to a vacuum source through the fluid passage 34 and/or the fluid passage 35, and is evacuated to develop a vacuum therein. The pressure chamber 23 and/or the pressure chamber 24 now attracts the semiconductor wafer W under vacuum to the lower surface of the top ring 1. Then, the top ring 1 holding the semiconductor wafer W under vacuum is moved in its entirety to a position above the polishing table 100 having the polishing surface (the polishing pad 101). The outer circumferential edge of the semiconductor wafer W is retained by the retainer ring 3, so that the semiconductor wafer W will not be dislodged from the top ring 1.

Then, the pressure chamber 23 and/or the pressure chamber 24 release the semiconductor wafer W. At the same time, the top ring air cylinder 111 connected to the top ring drive shaft 11 is operated to press the retainer ring 3 fixed to the lower end of the top ring 1 against the polishing surface of the polishing table 100 under a predetermined pressing force. Thereafter, the pressure chamber 21 is supplied with the pressurized fluid to lower the chucking plate 6, thereby pressing the edge membrane 7 and the intermediate air bag 19 against the semiconductor wafer W. The lower surfaces of the edge membrane 7 and the intermediate air bag 19 are now reliably held in intimate contact with the upper surface of the semiconductor wafer W. In this state, the pressure chambers 22 through 25 are supplied with the pressurized fluid under respective pressures, thereby lifting the chucking plate 6 and pressing the semiconductor wafer W against the polishing surface of the polishing table 100. At this time, since the stretchable and contractible portions 40a, 40b of the edge membrane 7 are stretched so as to follow the upward movement of the chucking plate 6, the lower surface (the contact portion 8) of the edge membrane 7 is held against the outer circumferential edge of the semiconductor wafer W in a constant contact area. The polishing liquid Q which has been supplied from the polishing liquid supply nozzle 102 is retained on the polishing pad 101. The semiconductor wafer W is now polished with the polishing liquid Q being present between the surface (the lower surface) of the semiconductor wafer W and the polishing pad 101.

With the top ring (substrate holding apparatus) 1 according to the present embodiment, since the area in which the edge membrane 7 and the outer circumferential edge of the semiconductor wafer W contact each other is kept constant, the pressing force imposed on the outer circumferential edge of the semiconductor wafer W is prevented from changing. Therefore, the entire surface of the semiconductor wafer W including its outer circumferential edge can be pressed against the polishing surface under a uniform pressing force. As a result, the polishing rate on the outer circumferential edge of the semiconductor wafer W is prevented from being lowered, and the polishing rate in a region that is positioned radially inwardly of the outer circumferential edge of the semiconductor wafer W is prevented from being locally increased. Specifically, if the semiconductor wafer has a diameter of 200 mm, then the polishing rate in a region that is positioned about 20 mm from the outer periphery of the semiconductor wafer W is prevented from being increased, and if the semiconductor wafer has a diameter of 300 mm, then the polishing rate in a region that is positioned about 25 mm from the outer periphery of the semiconductor wafer W is prevented from being increased.

The circumferentially extending slit 18 defined in the contact portion 8 of the edge membrane 7 is effective to increase the stretchability of the circumferential wall 9 (the outer circumferential wall 9a and the inner circumferential wall 9b) in the downward direction. Therefore, even when the pressure of the fluid supplied to the pressure chamber 22 is reduced, the range of contact between the edge membrane 7 and the semiconductor wafer W is kept proper, thus allowing the semiconductor wafer W to be pressed under a smaller pressing force.

The regions of the semiconductor wafer W which are positioned respectively underneath the pressure chambers 22, 23, 24 and 25 are pressed against the polishing surface under the pressures of the pressurized fluid supplied to the respective pressure chambers 22, 23, 24 and 25. Therefore, by controlling the pressures of the pressurized fluid supplied to the respective pressure chambers 22, 23, 24 and 25, the entire surface of the semiconductor wafer W can be pressed against the polishing surface under a uniform force, achieving a uniform polishing rate over the entire surface of the semiconductor wafer W. Similarly, the pressure of the pressurized fluid supplied to the pressure chamber 21 can be regulated by the regulator R2 to change the pressing force for pressing the retainer ring 3 against the pressing pad 101. In this manner, the polishing profile of the semiconductor wafer W can be controlled by appropriately regulating the pressing force for pressing the retainer ring 3 against the pressing pad 101 and the pressing force for pressing the semiconductor wafer W against the polishing pad 101 with the pressure chambers 22, 23, 24 and 25 while the semiconductor wafer W is being polished. The semiconductor wafer W has a region to which the pressing force is applied from the fluid through the contact portion of the intermediate air bag 19, and a region to which the pressure of the pressurized fluid is directly applied. The pressing forces applied to these regions of the semiconductor wafer Ware identical to each other.

As described above, the pressing force for pressing the retainer ring 3 against the polishing pad 101 and the pressing force for pressing the semiconductor wafer W against the polishing pad 101 with the pressurized fluid supplied to the respective pressure chambers 22, 23, 24 and 25 are appropriately regulated to polish the semiconductor wafer W.

While the semiconductor wafer W is being polished as described above, when the pressurized fluid is supplied to the pressure chambers 22, 23, 24 and 25 under respective different pressures to press the semiconductor wafer W in locally different pressing states, if the two sensors for two adjacent pressure chambers of the sensors S1 through S4 in the respective fluid passages 33 through 36 for supplying the fluid to the pressure chambers 22 through 25 detect a certain fluid flow direction, then it is judged that the boundary (membrane) between those two adjacent pressure chambers is damaged or broken. At this time, the top ring 1 attracts the semiconductor wafer W under vacuum and is lifted from the polishing surface, thereby stopping polishing of the semiconductor wafer W. If the two sensors for two adjacent pressure chambers detect a fluid flow at the same flow rate, then it is also judged that the boundary (membrane) between those two adjacent pressure chambers is damaged or broken. At this time, the polishing of the semiconductor wafer W is also stopped.

When the polishing process is finished, the supply of the pressurized fluid to the pressure chambers 22, 23, 24 and 25 is stopped, and the pressure chambers 22, 23, 24 and 25 are vented to the atmosphere. Then, a negative pressure is developed in the pressure chamber 23 and/or the pressure chamber 24 to attract the semiconductor wafer W again to the lower end surface of the top ring 1 under vacuum. At this time, the pressure of the pressure chamber 21 is made an atmospheric pressure or a negative pressure. This is because if the pressure in the pressure chamber 21 remains high, the semiconductor wafer W would be locally pressed against the polishing surface by the lower surface of the chucking plate 6.

After the semiconductor wafer W is thus held under vacuum, the top ring 1 in its entirety is positioned in the transfer position for the semiconductor wafer W, and the vacuum attraction of the semiconductor wafer W by the pressure chamber 23 and/or the pressure chamber 24 is released. Then, a fluid (e.g., a pressurized fluid or a mixture of nitrogen and pure water) is ejected from the fluid passage 34 to the semiconductor wafer W, thereby removing the semiconductor wafer W from the top ring 1.

While an embodiment of the present invention has been described above, the present invention is not limited to the above embodiment, but may be embodied in various different forms within the scope of the technical idea thereof.

According to the substrate holding apparatus of the present invention, fluid leakage from pressure chambers or fluid leakage between the substrate, which is an object to be polished, and the membrane (elastic membrane) can be detected by detecting a flowing state of the pressurized fluid. Therefore, damage to the elastic membrane which defines the pressure chambers, assembly failure of the top ring, or the service life of components of the top ring can be detected. Since the pressures in the pressure chambers can be kept under preset pressure levels, the possibility of damage to the substrate can be lowered. Furthermore, not only fluid leakage from the pressure chambers but also dislodgment of the substrate from the lower surface of the top ring during polishing can be detected, thus further reducing the possibility of damage to the substrate.

INDUSTRIAL APPLICABILITY

The present invention is applicable to a substrate holding apparatus for holding a substrate such as a semiconductor wafer to be polished and pressing the substrate against a polishing surface. The present invention is also applicable to a polishing apparatus having such a substrate holding apparatus.

The invention claimed is:

1. A polishing apparatus comprising:
   a polishing table having a polishing surface; and
   a substrate holding apparatus for holding a substrate and pressing the substrate against said polishing surface, said substrate holding apparatus comprising:
   a top ring body for holding the substrate, said top ring body having a plurality of pressure chambers defined in said top ring body;
   a plurality of fluid passages for supplying a fluid to said to said plurality of pressure chambers; and
   a plurality of sensors disposed in said plurality of fluid passages, respectively, operable to detect at least one of a flow direction of the fluid, a flow velocity of the fluid and a flow rate of the fluid that is supplied to and flows through said plurality of fluid passages.

2. A polishing apparatus according to claim 1, wherein said plurality of sensors include sensors disposed in two of said fluid passages connected to two of said pressure chambers, respectively, that are adjacent to each other and separated by a boundary.

3. A polishing apparatus according to claim 1, wherein said plurality of sensors are operable to detect both the flow velocity of the fluid and the flow direction of the fluid.

4. A polishing apparatus according to claim 1, and further comprising a controller for controlling said polishing apparatus, wherein polishing of a substrate is stopped when two of said plurality of sensors, disposed in said two of said fluid passages connected to two of said pressure chambers, respectively, that are adjacent to each other, detect respective fixed flow directions of the fluid.

5. A polishing apparatus according to claim 4, wherein the fixed flow directions are a flow direction of the fluid corresponding to pressurizing the substrate and a flow direction of the fluid corresponding to depressurizing the substrate.

6. A polishing apparatus according to claim 4, wherein the fixed flow directions are opposite directions to each other.

7. A polishing apparatus according to claim 1, and further comprising a controller for controlling said polishing apparatus wherein polishing of a substrate is stopped when two of said plurality of sensors, disposed in said two of said fluid passages connected to two of said pressure chambers, respectively, that are adjacent to each other, detect the same flowrate of the fluid.

8. A polishing apparatus according to claim 1, and further comprising a controller for controlling said polishing apparatus wherein polishing of a substrate is stopped when two of said plurality of sensors, disposed in said two of said fluid passages connected to two of said pressure chambers, respectively, that are adjacent to each other, detect respective fixed flow directions of the fluid and respective fixed flow rates of the fluid.

9. A polishing apparatus according to claim 8, wherein the fixed flow directions are opposite directions to each other.

10. A polishing apparatus according to claim 8, wherein the fixed flow directions are opposite directions to each other and the fixed flow rates are identical to each other.

11. A polishing apparatus according to claim 1, and further comprising a controller for controlling said polishing apparatus wherein polishing of a substrate is not stopped irrespective of a flow rate of the fluid detected by said sensor until a pressure variation in said fluid passage reaches a predetermined value or less or a predetermined rate or less of a setting pressure after a pressurizing condition in said pressure chamber is reached.

12. A polishing apparatus according to claim 1, further comprising a plurality of pressure sensors disposed in said plurality of fluid passages, respectively.

* * * * *